(12) United States Patent
Kim et al.

(10) Patent No.: US 7,968,371 B2
(45) Date of Patent: Jun. 28, 2011

(54) SEMICONDUCTOR PACKAGE SYSTEM WITH CAVITY SUBSTRATE

(75) Inventors: OhSug Kim, Kyungkido (KR); DeaWhan Kim, Kyungkido (KR); SangJo Kim, Kyungkido (KR)

(73) Assignee: STATS ChipPAC Ltd., Singapore (SG)

(*) Notice: Subject to any disclaimer, the term of this patent is extended or adjusted under 35 U.S.C. 154(b) by 109 days.

(21) Appl. No.: 11/164,336

(22) Filed: Nov. 18, 2005

(65) Prior Publication Data
US 2006/0170092 A1 Aug. 3, 2006

Related U.S. Application Data

(60) Provisional application No. 60/649,239, filed on Feb. 1, 2005.

(51) Int. Cl.
*H01L 21/00* (2006.01)

(52) U.S. Cl. ........ 438/107; 438/110; 438/106; 438/118; 257/690; 257/E21.499

(58) Field of Classification Search .................. 438/107, 438/110, 106, 116, 118; 257/690, E21.499
See application file for complete search history.

(56) References Cited

U.S. PATENT DOCUMENTS

| | | | |
|---|---|---|---|
| 5,561,323 A | 10/1996 | Andros et al. | |
| 5,583,377 A | 12/1996 | Higgins, III | |
| 5,990,545 A | 11/1999 | Schueller et al. | |
| 6,011,694 A | 1/2000 | Hirakawa | |
| 6,215,175 B1 | 4/2001 | Kinsman | |
| 6,324,067 B1 * | 11/2001 | Nishiyama | 361/761 |
| 6,486,537 B1 * | 11/2002 | Liebhard | 257/667 |
| 6,608,375 B2 * | 8/2003 | Terui et al. | 257/691 |
| 6,664,617 B2 | 12/2003 | Siu | |
| 6,853,070 B2 | 2/2005 | Khan et al. | |
| 6,867,066 B2 | 3/2005 | Yamaguchi | |
| 6,900,535 B2 * | 5/2005 | Zhou | 257/707 |
| 6,949,404 B1 * | 9/2005 | Fritz et al. | 438/106 |
| 6,949,823 B2 | 9/2005 | Schott et al. | |
| 6,956,182 B2 | 10/2005 | Gregory | |
| 2004/0036160 A1 * | 2/2004 | Akram et al. | 257/706 |
| 2005/0139974 A1 * | 6/2005 | Huang et al. | 257/678 |

FOREIGN PATENT DOCUMENTS
KR 1020030066996 A 8/2003
* cited by examiner

*Primary Examiner* — Junghwa M Im
(74) *Attorney, Agent, or Firm* — Mikio Ishimaru

(57) ABSTRACT

A semiconductor package system is provided including providing a cavity substrate having a cavity provided therein, attaching a metal die pad to the cavity substrate, attaching a semiconductor die in the cavity to the metal die pad, and attaching solder connectors to the cavity substrate for connection on the system board with the metal die pad on the system board.

20 Claims, 4 Drawing Sheets

SEMICONDUCTOR PACKAGE SYSTEM WITH CAVITY SUBSTRATE

CROSS-REFERENCE TO RELATED APPLICATION(S)

This application claims the benefit of U.S. Provisional Patent Application Ser. No. 60/649,239 filed Feb. 1, 2005, and the subject matter thereof is hereby incorporated herein by reference thereto.

TECHNICAL FIELD

The present invention relates generally to semiconductor package system, and more particularly to a method and apparatus for semiconductor package with improved thermal dissipation and improved volumetric size.

BACKGROUND ART

Semiconductor package is the process in which a semiconductor die is encapsulated for protection and to provide ease of handling and usage. Packaged semiconductor dies can be handled at high speed by automatic machines for solder mounting upon the system boards. Solder is applied through a heating process forming electrical connections between system boards and contacts on the semiconductor dies. System boards provide wiring to interconnect electronic components and semiconductor dies. Semiconductor dies are used within electronic systems having many semiconductor dies soldered upon one or more system boards. Common examples of electronic systems are computers, cell phones and audio-video systems.

Common techniques for enclosing a semiconductor die include encapsulation and direct attachment methods. In both of these methods the semiconductor die, which is a small rectangular semiconductor die cut from a larger semiconductor wafer is covered with a polymer to seal and protect the semiconductor die. The polymer prevents the entry of water and other contaminants, which can cause problems during the various manufacturing processes.

The encapsulation process seals the semiconductor die within a polymer block and may include a set of exposed contacts connected to the semiconductor die with wires bonded to the semiconductor die and the exposed contacts. The direct attachment process provides an unpackaged semiconductor die adhered directly upon a system board, and provides wires bonded to the semiconductor die and the system board, followed by a complete covering of the semiconductor die and wiring with a sealing polymer.

Packaged semiconductors control and switch electrical signals and are seldom 100% efficient, packaged semiconductors therefore have losses that result in heating of the semiconductor die. Removal of heat from the semiconductor package prevents semiconductor overheating. High internal heat also causes stress cracks when dissimilar materials expand and contract at different rates with temperature. Modern electronic systems operate at ever faster speeds. Faster speeds lead to faster switching of signals, which leads to faster generation of losses and thus increased heat. Providing a means for spreading heat or providing a path for rapid heat flow within semiconductor packages and beyond has been a long sought need.

Modern electronic systems demand continued decreases in size. The volumetric size of systems is dependent not only on the area of the semiconductor package, but also on the thickness of the semiconductor package. Using thin semiconductor packages allows smaller electronic systems to be built. Current trends place a premium on semiconductor packages that can incorporate multiple semiconductor dies in stacks or stacks of packages.

One proposed solution involves providing a heat sink or metal slug attached to the semiconductor package to help remove the heat. Unfortunately, this additional element adds to the package thickness, and prevents stacking of multiple packages.

In most ball grid array package based lamination substrates, signal traces are created on a substrate made from BT-resin base, then solder balls on the bottom of the substrate are used to connect signal trace and board, and encapsulation material protects the chip and gold wire. But, in this package type, most of the junction generated heat can escape through the package top surface and board. However, the thermal path from the junction to the board is not good, because only the older balls are connected from the package to the board. To improve the thermal performance of the package, the thermal path toward the board has to be elevated.

Another proposed solution involves mounting the semiconductor die within a metal interior surface housing having sidewalls and flanges for retention. Unfortunately, this creates the need to use longer bond wires. Additionally, added vertical stress is created by the metal sidewalls of the housing.

Thus, a thinner package with high thermal dissipation is really required. In view of existing semiconductor packages it is increasingly critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides a semiconductor package system is provided including providing a cavity substrate having a cavity provided therein, attaching a metal die pad to the cavity substrate, attaching a semiconductor die in the cavity to the metal die pad, and attaching solder connectors to the cavity substrate for connection on the system board with the metal die pad on the system board.

Certain embodiments of the invention have other advantages in addition to or in place of those mentioned above. The advantages will become apparent to those skilled in the art from a reading of the following detailed description when taken with reference to the accompanying drawings.

BEST MODE FOR CARRYING OUT THE INVENTION

Figure 1:
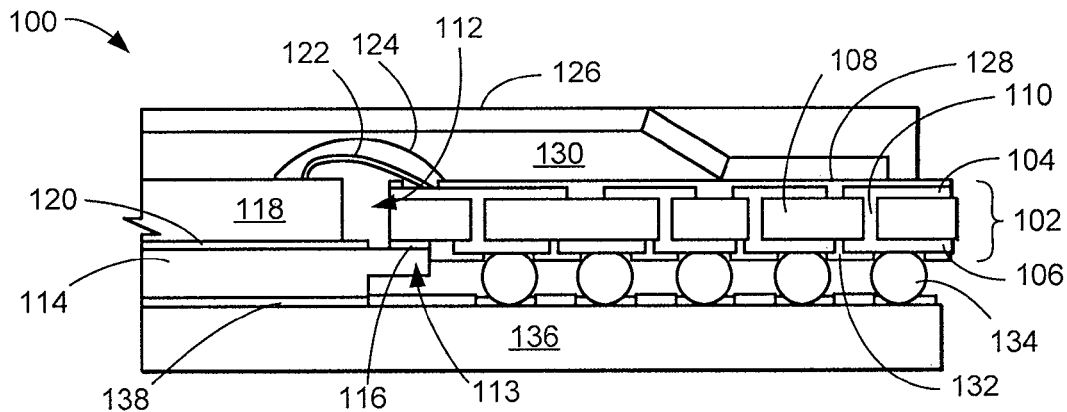
FIG. 1 is a cross-sectional view of half a semiconductor package system in accordance with an embodiment of the present invention.

The following embodiments are described in sufficient detail to enable those skilled in the art to make and use the invention, and it is to be understood that other embodiments would be evident based on the present disclosure and that process or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known process steps are not disclosed in detail. Also top views are not shown since they are well known and would only show rectangles of varying sizes without providing additional information.

Additionally, the drawings showing embodiments of the semiconductor package system are semi-diagrammatic and not to scale and, particularly, some of the dimensions are for the clarity of presentation and are shown exaggerated in the drawing FIGs.

The term "horizontal" as used herein is defined as a plane parallel to the plane or surface of the semiconductor die, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means that there is direct contact among elements.

In the present invention, metal die pads are used to improve thermal path and die attach and to get a shorter distance from the semiconductor die junction to the system board. The metal die pads are attached to bottom surface of a cavity substrate. Attachment material for the metal pads can be applied using a thermo setting adhesive or epoxy.

To protect the bond wires during injection mold process, the bond wires are coated by encapsulation material before the injection mold process The metal die pads are connected to the system board by soldering or thermal grease to improve thermal performance of package.

A top heat sink can also be encapsulated in the package to further improve thermal performance. The present invention can be used for high power dissipation devices.

At the same time, a cavity substrate is used in the package to obtain a low profile.

Referring now to FIG. 1, therein is shown a cross-sectional view of half a semiconductor package system 100 in accordance with an embodiment of the present invention. Only half is shown for clarity since the other half is the same as the portion shown.

The semiconductor package system 100 includes a cavity substrate 102 and a substrate top foil 104 and a substrate bottom foil 106. The cavity substrate 102 has the substrate top and bottom foils 104 and 106 respectively attached to a top and a bottom surface of a substrate core 108. The substrate top and bottom foils 104 and 106 are joined by vias 110.

The cavity substrate 102 is used in the semiconductor package system 100 to obtain a low profile by having a cavity 112 therethrough, which includes an underside rim 113, of which half is shown, exposed from the bottom surface of the substrate core 108. A metal die pad 114 is bonded in the underside rim 113 of the cavity substrate 102 by an adhesive 116, such as a thermo setting adhesive or epoxy.

A semiconductor die 118 is die attached by a conductive adhesive 120 to the metal die pad 114. Bond wires 122 connect the semiconductor die 118 to the substrate top foil 104. The bond wires 122 are encapsulated in a wire encapsulant 124.

A top heat sink 126 is located over and around the semiconductor die 118 on a top foil protector 128, which is over the substrate top foil 104 and on the cavity substrate 102, and the structure is placed in a mold compound 130.

A bottom foil protector 132, such as a solder resist or solder mask, on the substrate bottom foil 106 has openings for solder balls 134 to be placed in contact with the substrate bottom foil 106. The bottom foil protector 132 may be spaced away from the cavity 112 in order to expose the underside rim 113, on the bottom surface of the substrate core 108, which is used to attach the metal die pad 114 by the adhesive 116. The underside rim 113 is bordered by the cavity 112 on one border and the bottom foil protector 132 on the other border.

A system board 136 has printed wiring 138 on which the semiconductor package system 100 is connected by the solder balls 134. The connection also causes the metal die pad 114 to also be on the printed wiring 138 on the system board 136. While there may be a conductive grease between the metal die pad 114 and the printed wiring 138, the metal die pad 114 would be considered to be on and directly in contact with the printed wiring 138 on the system board 136 for purposes of the present invention so heat can be conducted away from the semiconductor die 118 to the system board 136.

Figure 2:
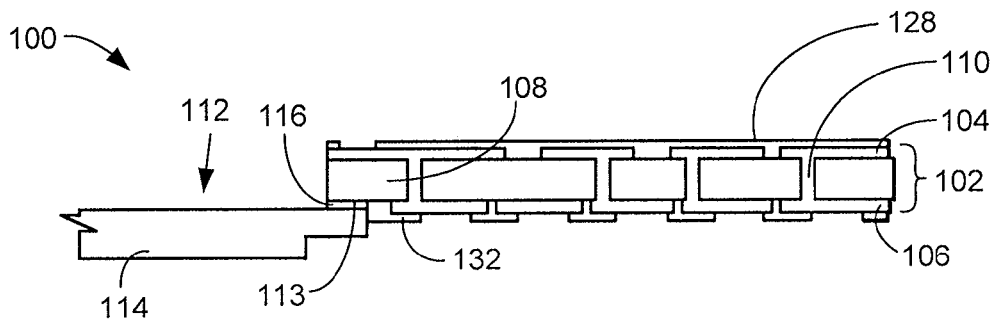
FIG. 2 is a cross-sectional view of the structure of FIG. 1 in an intermediate stage of manufacture.

Referring now to FIG. 2, therein is shown a cross-sectional view of the structure of FIG. 1 in an intermediate stage of manufacture. The cavity substrate 102 has the cavity 112 of which half is shown. The underside rim 113 is provided on the bottom surface of the cavity substrate 102 bordered by the cavity 112 and the bottom foil protector 132 on the bottom surface of the cavity substrate 102. The metal die pad 114 is bonded at its extremity to the underside rim 113 of the substrate core 108 by the adhesive 116, such as a thermo setting adhesive or epoxy. The substrate core 108 can be a material such as a BT resin or polyimide film.

Figure 3:
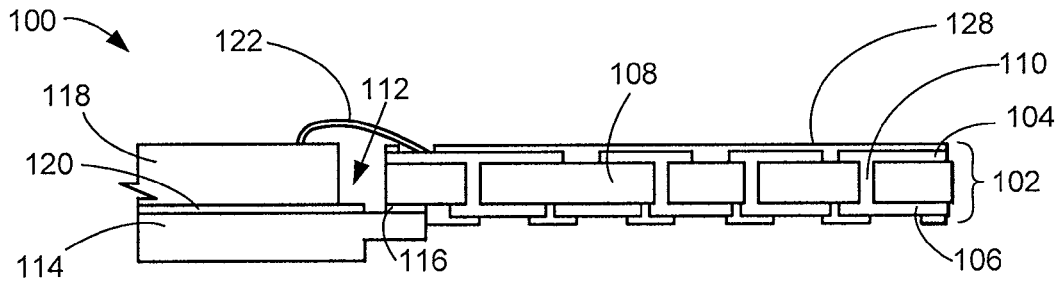
FIG. 3 is a close-up cross-sectional view of the structure of FIG. 2 in a die attach stage of manufacture.

Referring now to FIG. 3, therein is shown a close-up cross-sectional view of the structure of FIG. 2 in a die attach stage of manufacture. The semiconductor die 118 is die attached by the conductive adhesive 120, which may also be a thermo setting adhesive or epoxy, to the metal die pad 114, which may be any conductive metal. The bond wires 122 connect the semiconductor die 118 to the substrate top foil 104. The bond wires 122 may be of conductors such as copper or gold.

Figure 4:
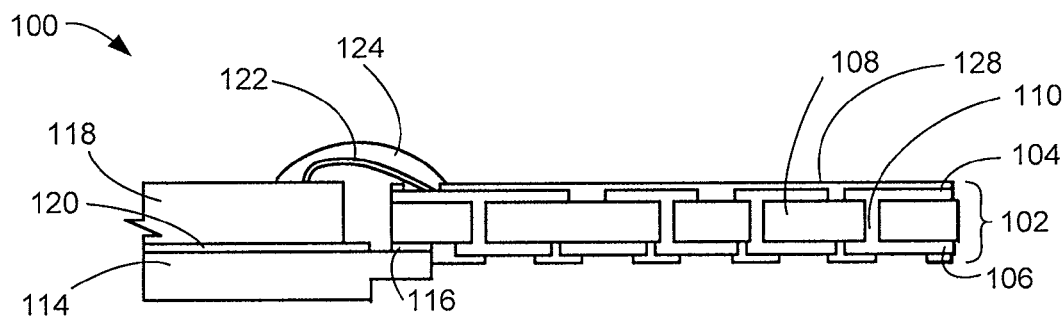
FIG. 4 is a cross-sectional view of the structure of FIG. 3 in a bond wire encapsulation stage of manufacture.

Referring now to FIG. 4, therein is shown a cross-sectional view of the structure of FIG. 3 in a bond wire encapsulation stage of manufacture. The bond wires 122 are encapsulated in the wire encapsulant 124, which is a protective material such as epoxy.

Although optional, it has been found that, when the bond wires 122 are encapsulated, the wire encapsulant 124 help prevents damage to the bond wires 122 when the mold compound 130 is injected under pressure around the bond wires 122.

Figure 5:
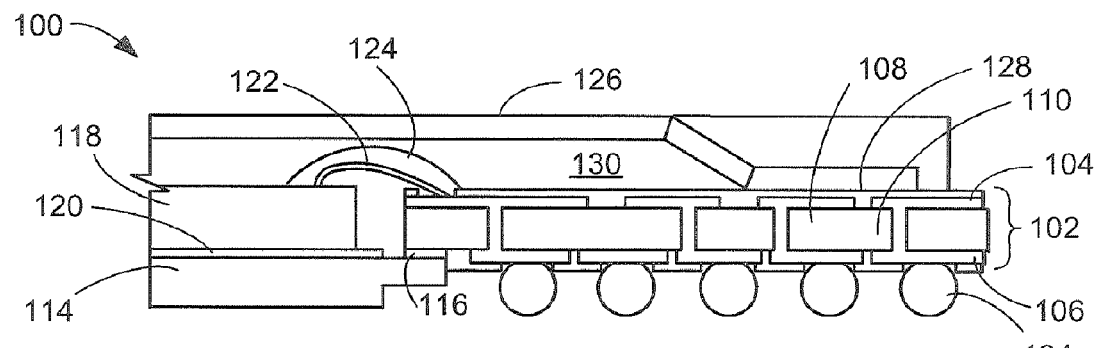
FIG. 5 is a cross-sectional view of the structure of FIG. 4 in a die encapsulation stage of manufacture.

Referring now to FIG. 5, therein is shown a cross-sectional view of the structure of FIG. 4 in a die encapsulation stage of manufacture. The top heat sink 126 is placed over the semiconductor die 118 and bonded on the top foil protector 128. This provides an upper heat transfer path. The structure is placed in a mold and the mold compound 130 is injected into the mold and around the semiconductor die 118, the wire encapsulant 124 and the top heat sink 126 on the cavity substrate 102.

Generally, the cavity substrate 102 is removed from the mold and then flipped for deposition and bonding of the solder balls 134 in contact with the substrate bottom foil 106.

Figure 6:
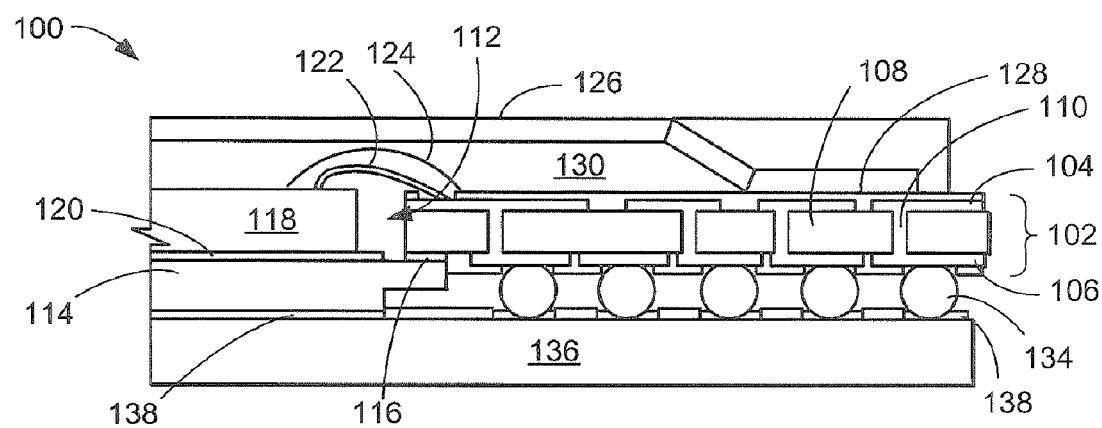
FIG. 6 is a cross-sectional view of the structure of FIG. 5 in system board mounting stage of manufacture.

Referring now to FIG. 6 is a cross-sectional view of the structure of FIG. 5 in system board mounting stage of manufacture. The system board 136 has the printed wiring 138 to which the semiconductor package system 100 is connected by the solder balls 134. The system board 136 can also be a BT resin or a polyimide film.

The connection by the solder balls 134 also causes the metal die pad 114 to also connect to the printed wiring 138, which can act to conduct heat away from the semiconductor die 118.

The metal die pad 114 can be biased to an electrical signal level by the printed wiring 138 that can be electrically conducted to the semiconductor die 118.

Since the semiconductor die 118 is in the cavity 112, it is possible to have a semiconductor package system 100 that is very thin. The inventors have named the semiconductor package system 100 a MDPGBA or metal down pad ball grid array.

Figure 7:
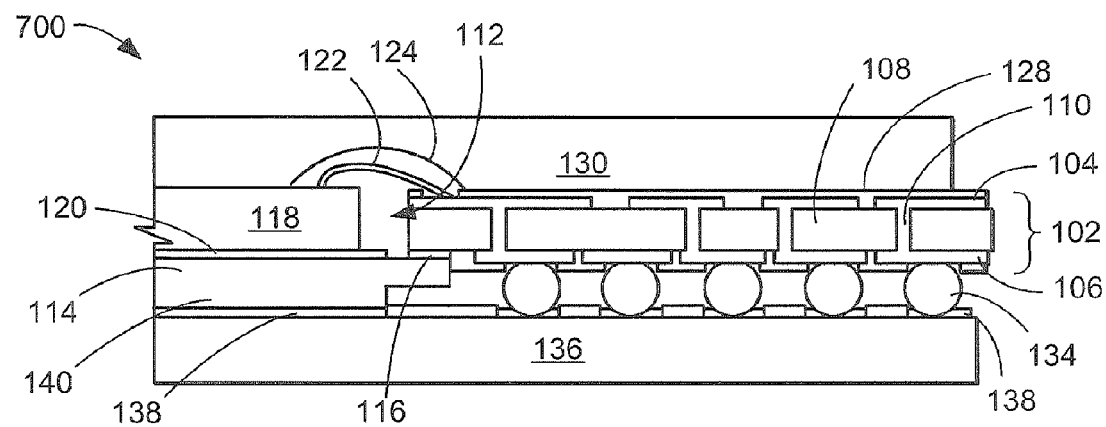
FIG. 7 is a cross-sectional view of half a semiconductor package system in accordance with another embodiment of the present invention.

Referring now to FIG. 7, therein is shown a cross-sectional view of half a semiconductor package system 700 in accordance with another embodiment of the present invention. In the semiconductor package system 700, an upper heat sink is not included in the system.

Figure 8:
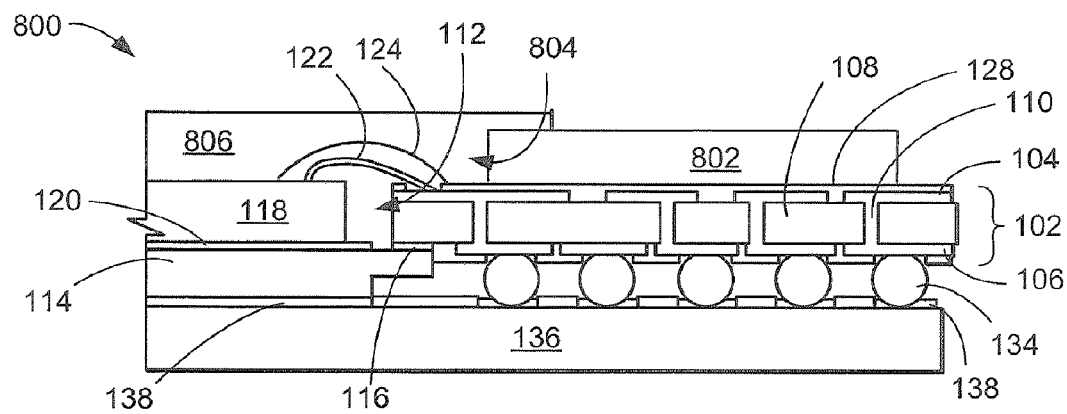
FIG. 8 is a cross-sectional view of half a semiconductor package system in accordance with still another embodiment of the present invention.

Referring now to FIG. 8, therein is shown a cross-sectional view of half a semiconductor package system 800 in accordance with still another embodiment of the present invention. A heat sink 802 having a cavity 804 is bonded to the top foil protector 128. A mold compound 806 is then injection molded into the cavity 804. Since the thickness of the semiconductor package system 800 is determined by thickness of the mold compound 806, by keeping the heat sink 802 to thinner than the thickness of the mold compound 806 over the cavity substrate 102, the thickness of the semiconductor package system 800 is not changed by the heat sink 802.

The inventors have named the semiconductor package system 100 a MDPGBA-3 or metal down pad ball grid array type 3.

Figures 9, 10:
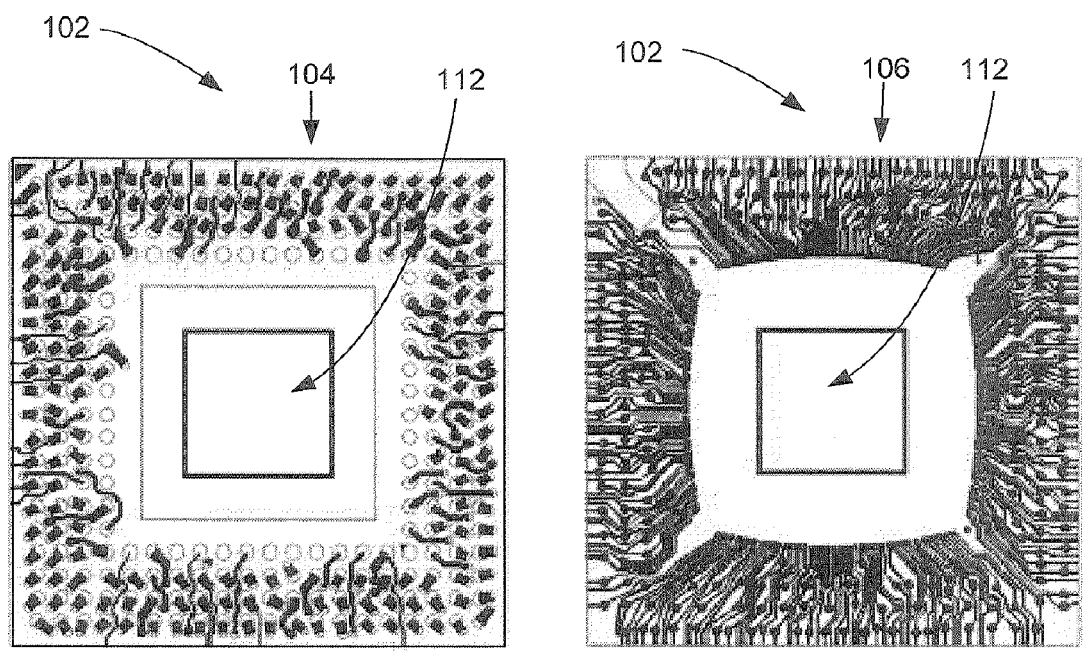
FIG. 9 is a top view of a cavity substrate in accordance with an embodiment of the present invention.
FIG. 10 is a bottom view of the cavity substrate of FIG. 9.

Referring now to FIG. 9, therein is shown a top view of a cavity substrate 102 in accordance with an embodiment of the present invention. The cavity substrate 102 has the cavity 112 centrally located with the substrate top foil 104 around the cavity 112.

Referring now to FIG. 10, therein is shown a bottom view of the cavity substrate 102 of FIG. 9. The cavity substrate 102 has the cavity 112 centrally located with the substrate bottom foil 106 around the cavity 112.

Figure 11:
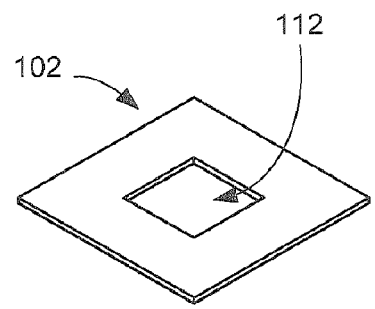
FIG. 11 is an isometric view of the cavity substrate of FIG. 10.

Referring now to FIG. 11, therein is shown an isometric view of the cavity substrate 102 of FIG. 10. The cavity substrate 102 has the cavity 112 centrally located.

Figure 12:
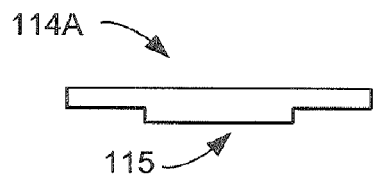
FIG. 12 is a cross-sectional view of a heat sink in accordance with embodiments of the present invention.

Referring now to FIG. 12, therein is shown a cross-sectional view of a metal die pad 114A in accordance with embodiments of the present invention. The metal die pad 114A shows a cross-section of different embodiments of the metal die pads 114C through E shown in FIGS. 14 through 17, respectively. The metal die pad 114A has a pedestal portion 115 and is bonded at its outer periphery or extremities to the cavity substrate 102 at the cavity 112.

Figure 13:
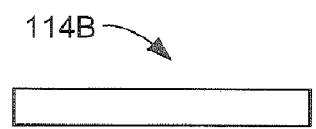
FIG. 13 is a cross-sectional view of a heat sink in accordance with embodiments of the present invention.

Referring now to FIG. 13, therein is shown a cross-sectional view of the metal die pad 114B in accordance with embodiments of the present invention. The metal die pad 114B shows a cross-section of different embodiments of the metal die pads 114D through E shown in FIGS. 14 through 17, respectively. The metal die pad 114B is shown as being flat and is bonded at its outer periphery or extremities to the cavity substrate 102 at the cavity 112.

Figure 14:
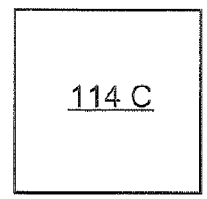
FIG. 14 is a top view of a heat sink in accordance with other embodiments of the present invention.

Referring now to FIG. 14, therein is shown a top view of metal die pad 114C in accordance with other embodiments of the present invention. The metal die pad 114C is flat and closes off at least a portion of the cavity 112 of FIG. 1 and is bonded at its outer periphery to the cavity substrate 102 at the cavity 112.

Figure 15:
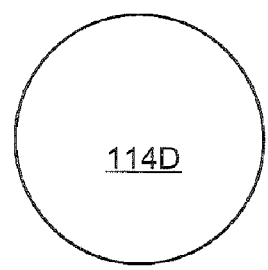
FIG. 15 is a top view of a heat sink in accordance with other embodiments of the present invention.

Referring now to FIG. 15, therein is shown a top view of metal die pad 114D in accordance with other embodiments of the present invention. The metal die pad 114D is round and is bonded at its outer periphery to the cavity substrate 102 at the cavity 112.

Figure 16:
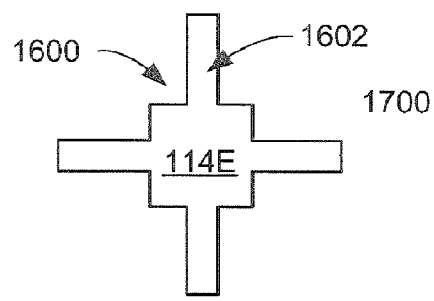
FIG. 16 is a top view of a heat sink in accordance with other embodiments of the present invention.

Referring now to FIG. 16, therein is shown a top view of metal die pad 114E in accordance with other embodiments of the present invention. The metal die pad 114E has a paddle portion 1600 and arms 1602 perpendicular to the paddle portion 1600, and is bonded at the outer periphery of the arms 1602 to the cavity substrate 102 at the cavity 112.

Figure 17:
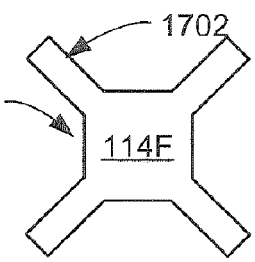
FIG. 17 is a top view of a heat sink in accordance with other embodiments of the present invention.

Referring now to FIG. 17, therein is shown a top view of metal die pad 114F in accordance with other embodiments of the present invention. The metal die pad 114F has a paddle portion 1700 and arms 1702 at 45 degree angles to the paddle portion 1700, and is bonded at the outer periphery of the arms 1702 to the cavity substrate 102 at the cavity 112.

Based on the above, it will be evident that the metal die pads can have either of the two cross-sections of FIGS. 13 and 14.

Figure 18:
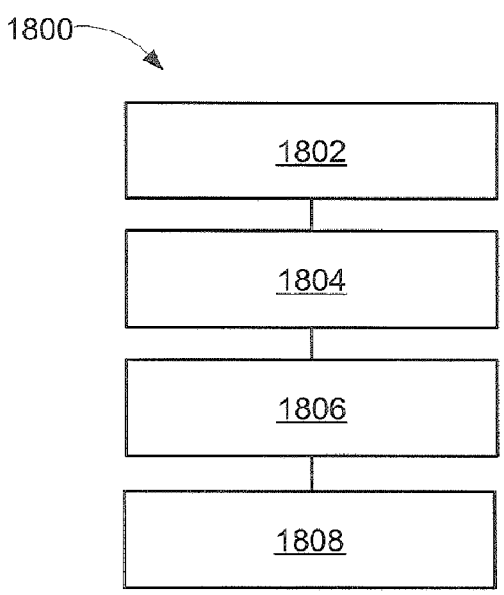
FIG. 18 is a flow chart of a semiconductor package system in accordance with an embodiment of the present invention.

Referring now to FIG. 18, therein is shown a flow chart of a semiconductor package system 1800 for manufacturing a semiconductor package system 100 in accordance with an embodiment of the present invention. The system 1800 includes providing a cavity substrate having a cavity provided therein in a block 1802; attaching a metal die pad to the cavity substrate in a block 1804; and attaching a semiconductor die in the cavity to the metal die pad in a block 1806; and attaching solder connectors to the cavity substrate for connection on the system board with the metal die pad on the system board in a block 1808.

It has been discovered that the present invention thus has numerous advantages. A principle advantage is that the present invention has reduced semiconductor package system height. Another advantage is improved thermal performance. Yet another important advantage of the present invention is that it valuably supports and services the historical trend of reducing costs, simplifying systems, and increasing performance.

These and other valuable aspects of the present invention consequently further the state-of-the-technology to at least the next level.

Thus, it has been discovered that the semiconductor package system of the present invention furnishes important and heretofore unknown and unavailable solutions, capabilities, and functional advantages for semiconductor package system.

The resulting processes and configurations are straightforward, cost-effective, uncomplicated, highly versatile and effective, can be implemented by adapting known technologies, and are thus readily suited for efficiently and economically manufacturing semiconductor package systems.

The resulting processes and configurations are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations, which fall within the scope of the included claims. All matters hithertofore set forth herein or shown in the accompanying drawings are to be interpreted in an illustrative and non-limiting sense.

What is claimed is:

1. A method of manufacturing a semiconductor package system comprising:
    providing a cavity substrate, having a cavity provided therethrough, including a top foil protector on a top surface of the cavity substrate and a bottom foil protector on a bottom surface of the cavity substrate;
    attaching a metal die pad in an underside rim of the cavity substrate;
    attaching a semiconductor die in the cavity to the metal die pad;
    bonding the semiconductor die with bond wires to the cavity substrate;
    encapsulating the bond wires in a wire encapsulant;
    encapsulating the semiconductor die and the wire encapsulant; and
    attaching solder connectors to the cavity substrate for connection on a system board with the metal die pad on the system board.

2. The method as claimed in 1 wherein:
    attaching the metal die pad includes forming the metal die pad to have a cross-section with a pedestal.

3. The method as claimed in 1 wherein attaching the metal die pad includes forming the metal die pad to have a rectangular cross-section.

4. The method as claimed in 1 wherein attaching the metal die pad further comprises forming the metal die pad as a paddle to have a shape of a circle, a square with perpendicular arms, or a square with 45 degree arms.

5. The method as claimed in 1 further comprising:
    conductively attaching the cavity substrate to conductive wiring on the system board; and
    conductively attaching the metal die pad to the conductive wiring on the system board.

6. A method of manufacturing a semiconductor package system comprising:
    providing a cavity substrate, having a cavity provided therethrough, including a top foil protector on a top surface of the cavity substrate and a bottom foil protector on a bottom surface of the cavity substrate;
    attaching a metal die pad in an underside rim of the cavity substrate at the bottom of the cavity;
    attaching a semiconductor die in the cavity to the metal die pad;
    bonding the semiconductor die with bond wires to the cavity substrate;
    encapsulating the bond wires in a wire encapsulant;
    encapsulating the semiconductor die and the wire encapsulant; and
    attaching solder balls to the cavity substrate for connection on a system board with the metal die pad on the system board.

7. The method as claimed in 6 wherein: attaching the metal die pad includes forming the metal die pad to have a cross-section with a pedestal; and attaching the metal die pad indicates bonding the metal die pad at outer extremities thereof to the cavity substrate.

8. The method as claimed in 6 wherein:
    attaching the metal die pad includes forming the metal die pad to have a rectangular cross-section; and
    attaching the metal die pad includes bonding the metal die pad at an outer periphery thereof to the cavity substrate.

9. The method as claimed in 6 wherein:
    attaching the metal die pad further comprises forming the metal die pad as a paddle to have a shape of a circle, a square with perpendicular arms, or a square with 45 degree arms; and
    attaching the metal die pad includes bonding the metal die pad at an outer periphery thereof to the cavity substrate.

10. The method as claimed in 6 further comprising:
    conductively attaching the cavity substrate to conductive wiring on the system board by the solder balls; and
    conductively attaching the metal die pad to the conductive wiring on the system board by a conductive interconnection.

11. A semiconductor package system for attachment to a system board, comprising:
    a cavity substrate, having a cavity provided therethrough, including a top foil protector on a top surface of the cavity substrate and a bottom foil protector on a bottom surface of the cavity substrate;
    a metal die pad attached in an underside rim of the cavity substrate;
    a semiconductor die in the cavity attached to the metal die pad; bond wires bonding the semiconductor die to the cavity substrate;
    a wire encapsulant encapsulating the bond wires;
    an encapsulant encapsulating the semiconductor die and the wire encapsulant; and
    solder connectors attached to the cavity substrate for connection on the system board with the metal die pad on the system board.

12. The system as claimed in 11 wherein:
    wherein the metal die pad has a cross-section with a pedestal.

13. The system as claimed in 11 wherein the metal die pad has a rectangular cross-section.

14. The system as claimed in 11 wherein the metal die pad is a paddle with a shape of a circle, a square with perpendicular arms, or a square with 45 degree arms.

15. The system as claimed in 11 further comprising:
    the system board having conductive wiring;

the cavity substrate conductively attached to the conductive wiring on the system board; and the metal die pad conductively attached to the conductive wring on the system board.

16. The system as claimed in 11 wherein:

the metal die pad is attached to the cavity substrate at the bottom of the cavity.

17. The system as claimed in 16 further comprising:

a top metal heat sink above or around the semiconductor die; and the top metal heat sink partially encapsulated in a mold compound.

18. The system as claimed in 16 wherein the metal die pad is bonded at the outer periphery thereof to the cavity substrate.

19. The system as claimed in 16 wherein the metal die pad is bonded at the outer extremity thereof to the cavity substrate.

20. The system as claimed in 16 wherein:

the cavity substrate is conductively attached to conductive wiring on the system board by solder balls; and the metal die pad is conductively attached to the conductive wiring on the system board by a conductive grease.

* * * * *